Oct. 21, 1958

B. H. TONGUE

BALANCED MIXER

Filed March 2. 1956

2,857,511

INVENTOR.
BEN H. TONGUE

BY Rines and Rines

ATTORNEYS

United States Patent Office 2,857,511

Patented Oct. 21, 1958

2,857,511

BALANCED MIXER

Ben H. Tongue, Westfield, N. J.

Application March 2, 1956, Serial No. 569,003

23 Claims. (Cl. 250—20)

Figures 1, 2:
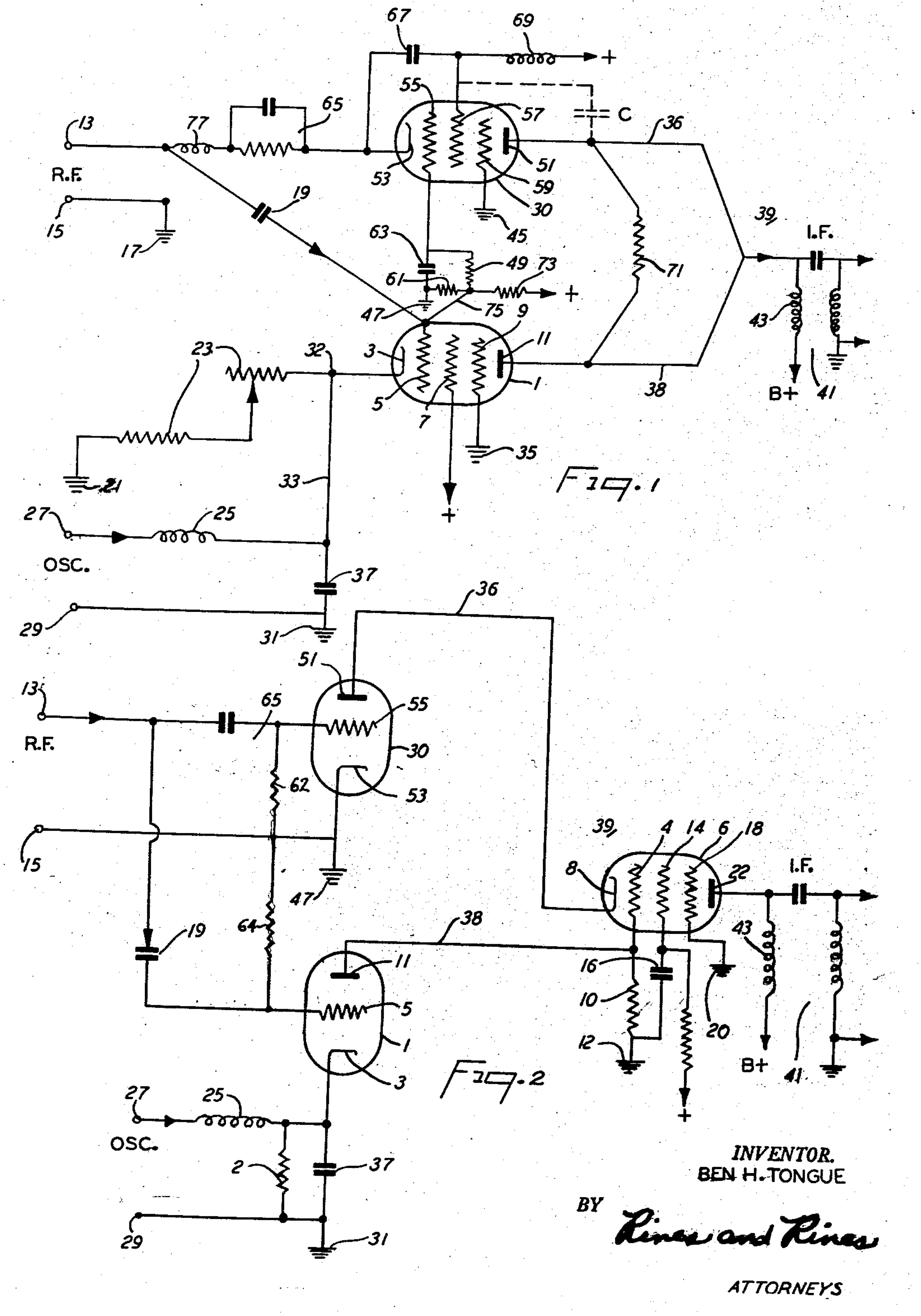

The present invention relates to mixer or heterodyning electric circuits and, more particularly, to electronic mixing circuits of the balanced type.

When an alternating-current signal is mixed in a heterodyning stage with oscillations of a different frequency from, for example, a local oscillator, beats are produced having intermediate frequencies corresponding to the sum and the difference of the signal frequency and the oscillation frequency. Not only are these sum and difference frequencies present in the output of the mixer, but frequencies corresponding to the original signal frequency and to the frequency of the oscillations are also present. Since the purpose of the mixing or heterodyning is usually to obtain one or the other of the sum and difference beat or intermediate frequencies, however, techniques have been evolved to filter out any undesired frequencies, such as the original signal frequency or the frequency of the oscillations. Many different types of circuits have been proposed for thus isolating the sum or the difference frequencies from the other undesired frequency components in the output of the mixer.

One common technique is to employ networks that may be tuned to the sum or the difference frequency, thereby to reject other frequency components present in the output of the mixer. Such tuned frequency discrimination, however, has serious limitations, particularly at the higher frequencies where the sum or difference frequency may be only very slightly different from the original alternating-current signal frequency or the frequency of the oscillations mixed therewith. Included in other proposals to solve this problem, therefore, are so-called balanced mixers of the push-pull type. A pair of electron tubes operated in push-pull are fed the alternating-current signal and the oscillations to be heterodyned therewith, and a tuned circuit is connected in the push-pull outputs of the tubes. Any component of the original alternating-current signal frequency or of the frequency of the oscillations that may be present in the output tuned circuit will be fed into the output circuit from one tube in one phase and from the other tube in the opposite phase. Cancellation of such undesired frequencies therefore results. The desired sum or difference frequency may be extracted by means of a circuit tuned thereto and coupled to the output circuit of the push-pull balanced mixer. Such a proposal, however, is extremely difficult to operate over relatively wide frequency bands, particularly in the high radio-frequency spectrum. There are several reasons for this including the fact that it is difficult for the output tuned circuit to be balanced for all frequencies over a wide frequency range, so that there is not exact cancellation in the output of the undesired original alternating-current signal frequency or the frequency of the oscillations mixed therewith.

In addition to the above disadvantages of prior-art mixer systems, there are cases where it is desired that the output tuned circuit be not tuned exactly to the sum or the difference intermediate frequency, but, rather, be tuned to frequencies to one side thereof. When the alternating-current signal frequency or the oscillation frequency are very close to the beat or intermediate frequency, it is virtually impossible to utilize such a tuned circuit in the output since it will respond to the alternating-current signal frequency or the oscillator frequency and will not select the desired beat frequency. The prior-art systems have not, therefore, been satisfactorily adaptable for use in circuits where it is desired to employ, for example, relatively broad output tuned circuits, such as double or other multiply peaked circuits, adapted to accept frequencies to the side of the desired beat or intermediate frequencies.

An object of the present invention, therefore, is to provide a new and improved balanced mixer circuit that shall not be subject to any of the disadvantages above-mentioned, but that, to the contrary, is particularly adapted for wide-frequency range operation.

A further object is to provide a new and improved balanced mixer for high radio frequencies.

Still a further object is to provide such a mixer that may be particularly adapted for use with multiply resonant or other broadly tuned circuits that are not peaked exactly at the desired beat or intermediate frequency.

Other and further objects will be explained hereinafter and will be more particularly pointed out in the appended claims.

In summary, the present invention contemplates the utilization of an electron tube mixer stage that is provided with single-ended input and output circuits. A desired signal of predetermined frequency lying within any wide band of frequencies is applied to the input circuit as are oscillations of frequency differing from the signal frequency by a predetermined intermediate frequency, thereby to produce in the output circuit the predetermined intermediate frequency as well as an undesired component of the radio-frequency signal. A further electron tube stage is provided having initially substantially the same transconductance as the mixer stage. This further stage is connected between the single-ended input and output circuits of the mixer stage. Means is provided for causing the transconductance of the stages substantially to track during any variation in the operating voltages thereof in order statically to balance the stages. Means is also provided for operating the further electron-tube stage to produce therefrom in the mixer-stage single-ended output circuit, a further component of the radio-frequency signal having substantially the same amplitude as, and opposite phase to, the undesired component of the original radio-frequency signal, thereby dynamically to balance out the said undesired component, as well. Preferred constructional details are hereinafter set forth.

The invention will now be described in connection with the accompanying drawing, Fig. 1 of which is a schematic circuit diagram illustrating the invention in preferred form, and Fig. 2 is a similar diagram of a modification.

Referring to Fig. 1, an alternating-current signal, labelled R. F., lying within a band of alternating-current frequencies is received at input terminals 13 and 15, the latter of which is shown grounded at 17. The term "ground" as used in this specification and in the claims, is intended to connote not only actual earthing, but also any desired reference potential, such as chassis potential and the like. For purposes of illustration, this signal will be considered as of radio frequency since this is an important application of the principles of the present invention; but it is to be understood, that the invention is equally useful with other frequency ranges, also. It is desired that this signal frequency R. F. be changed or heterodyned to a higher or lower intermediate frequency I. F., by mixing, beating, converting or heterodyning with appropriate oscillations from a source of local oscillations OSC. of frequency differing from the frequency of the signal R. F. by the desired intermediate frequency I. F. As an illustration, in the field of V. H. F. television, it may be desired to convert a signal frequency received in one channel, such as, for example, the low channel 2, having a frequency range of from about 54 to 60 megacycles, into the frequency range of an adjacent channel such as, for example, channel 4. In such a circumstance, the frequency of the oscillator OSC. will be adjusted to a value differing by approximately 12 megacycles from the channel-2 signal frequency in order to produce the desired intermediate frequency I. F. of from 66 to 72 megacycles. In this instance, the sum of the signal frequency R. F. and the frequency of the oscillations of the oscillator OSC. is desired. Since the frequency I. F. is, however, very close to the actual signal frequency R. F., the problem of eliminating undesired components of the original signal frequency R. F. appearing in the output of the mixer is quite acute. This is particularly so if the mixer of the present invention is to be utilized over the relatively wide channel frequency bands above mentioned. It is all the more acute where the network in the output circuit is to be a broadly tuned device, not sharply resonant to the intermediate frequency I. F. but, for example, multiply resonant to accept frequencies in the neighborhood of the intermediate frequency on either side thereof.

For purposes of illustration, the mixer electron tube stage is shown in the form of a pentode 1, having a cathode electrode 3, a control-grid electrode 5, a screen-grid electrode 7, a suppressor-grid electrode 9, and an anode or plate 11. The radio-frequency signal R. F. is shown applied from the input terminal 13 through a coupling condenser 19, to the control-grid electrode 5 of the pentode-mixer stage 1. The cathode 3 of the pentode 1 is shown grounded at 21 through a variable resistance electrical connection 23, being also by-passed to the ground by a condenser 37. The radio-frequency signal R. F. is thus applied by means of a single-ended input circuit to the control-grid electrode 5 of the grounded-cathode pentode 1.

Oscillations from a local oscillator, labelled OSC., which may, for example, be a crystal-controlled or other reference oscillator, are shown applied to terminals 27 and 29, the latter of which is grounded at 31. These oscillations are fed through an inductance 25 and by way of a conductor 33 to a point 32 in the cathode circuit that is above the ground potential point 21, thereby to heterodyne or beat with the signal frequency R. F. in the mixer tube 1. The screen grid 7 of the pentode 1 is connected to a positive source of potential, labelled +, and the suppressor grid 9 is grounded at 35.

Connected to the anode 11 of the pentode 1, is a single-ended output circuit 39 which may, in turn, connect to an output tuned circuit 41. The circuit 41, for purposes of illustration, is shown assuming the configuration of a $\pi$-type double-tuned network which may provide multiple responses adjacent the desired intermediate frequency I. F., for such purposes as providing a broad-band input circuit to a subsequent I. F. amplifier, not shown. Anode or plate voltage is supplied from the terminal B+ through the left-hand inductance 43 of the tuned circuit 41 and, by way of the output conductor 38, to the anode or plate 11 of the pentode 1. The pentode 1 will thus mix or heterodyne the radio-frequency signal R. F. with the oscillations of the oscillator OSC to produce in the output circuit 39 the intermediate frequencies, before referred to, as well as an undesired component of the original signal frequency R. F. It is, as before stated, the object of the present invention to eliminate that undesired component. This elimination, moreover, must be effected even though the frequency of the incoming signal R. F. be selected over a wide band of frequencies and it must be eliminated irrespective of any circuit-parameter or voltage variations that may occur in the circuit or in the supply voltages for the mixer tube 1.

In accordance with the present invention, the undesired component of the incoming radio-frequency signal R. F. is eliminated in the single-ended output circuit 39 with the aid of a further electron-tube stage 30, illustrated also as of the pentode variety. The further stage 30 produces, in accordance with the present invention, a component of the radio-frequency signal R. F. that is in anti-phase to any component of the signal R. F. that may pass through the mixer 1 to the output circuit 39, and is of substantially the same amplitude as the undesired component passing through the mixer 1 to the output circuit 39. Balance or cancellation of the undesired component in the output circuit 39 is thus achieved at all times. As before stated, this cancellation or balance must obtain over wide-frequency ranges and irrespective of variations in the voltage supply. It remains, accordingly, to examine the manner in which the stage 30 accomplishes these ends.

The pentode 30, like the pentode 1, is provided with a cathode 53, a control-grid electrode 55, a screen-grid electrode 57, a suppressor-grid electrode 59, and a plate or anode 51. The anode or plate voltage is provided by a conductor 36 which connects to the conductor 38 in the output circuit 39 of the mixer stage 1, thus being connected through the inductance 43 to the B+ terminal of the anode or plate-supply voltage source. The suppressor electrode 59, like the suppressor electrode 9 of the pentode 1, is grounded at 45. The pentode 30, however, unlike the grounded-cathode pentode 1, is operated as a grounded-grid pentode, the control-grid electrode 55 being grounded at 47 through resistors 49 and 61. A decoupling condenser is shown at 63 connected from the control-grid electrode 55 of the pentode 30 to the ground terminal 47. The cathode 53 of the grounded-grid pentode 30 is connected through a resistance-capacitance network 65 and an inductance 77, hereinafter more fully discussed, to the single-ended input-circuit terminal 13, before-mentioned. The R. F. signal is thus applied not only through the condenser 19 to the control-grid electrode 5 of the grounded-cathode pentode 1, as previously described, but it is applied, also, to the cathode 53 of the grounded-grid pentode 30. The screen-grid electrode 57 is shown coupled to the cathode 53 of the pentode 30 by the condenser 67. The screen-grid electrode 57 receives its screen potential through a radio-frequency choke 69 which connects to a further positive terminal, labelled +. Since it is the control-grid electrode 5 of the mixer tube 1 and the cathode 53 of the grounded-grid pentode 30 that respectively receive the incoming radio-frequency signal R. F., the resulting components of that radio-frequency signal appearing at the respective plates or anodes 11 and 51 will be of opposite phase. If the amplitude of the undesired component of this radio-frequency signal R. F. appearing at the anode 11 of the pentode 1 is substantially the same as the amplitude of the anti-phase component appearing at the anode or plate 51 of the pentode 30, accordingly, these opposite or out-of-phase components will be combined by respective conductors 38 and 36 of the output circuit 39, producing balance or cancellation of the undeesired component of the original radio-frequency signal R. F., eliminating the same from the output circuit 39.

This dynamic or signal balance may be achieved provided the transconductance of the tubes 1 and 30 remains at substantially the same value at all times. Two similar tubes 1 and 30 are therefore preferably chosen, having substantially the same transconductance. The relative amplitudes of the currents flowing through the tubes 1 and 30 between their respective anodes and cathodes is adjusted for the above-described desired equal-amplitude condition at the plates 11 and 51 by means of the variable resistor control 23, before mentioned, controlling the gain of the mixer pentode 1 relative to the gain of the stage 30. A parasitic stopper of oscillations is shown at 71 connected between the plates 51 and 11 of the respective pentodes 30 and 1.

In accordance with the present invention, it is also essential that balance be provided for static or direct-current conditions, as well as for the above-described dynamic or signal balance conditions. This end is accomplished by connecting the resistor 49 to the junction of bleeder resistors 61 and 73 providing bias voltage from a positive terminal + that may be tapped down from the B+ plate supply source, not only to the control-grid electrode 55 of the pentode 30, but, also, by way of a further conductor 75 to the control-grid electrode 5 of the mixer pentode 1. The two tubes 1 and 30 thus conduct freely in the static condition, acting as substantially constant-current devices. Any variations in the B+ supply voltage or in the bias voltage tapped therefrom, for the various electrodes, will thus cause substantially directly proportional changes in the current flowing in the tubes 1 and 30 irrespective of any dissimilar gain or other characteristics of the tubes 1 and 30. By this expedient, therefore, the values of the transconductance of the tubes 1 and 30 tend to track so that as the transconductance of one tube varies, the transconductance of the other tube varies substantially the same amount. This operation occurs, moreover, when relatively large cathode-load resistors are employed, as illustrated by the resistance of the network 65 in the case of the pentode 30, and the gain-adjusting resistors 23, in the case of the pentode 1.

It will therefore be seen that balance or cancellation of the undesired signal frequency is produced by the present invention, irrespective of variation in the signal frequency over wide limits and irrespective of variations in the supply voltages operating the circuits. As a typical illustration, the pentodes 1 and 30 may be of the 6CB6 type. The conversion or mixing problem may be to change from a V. H. F. television channel-2 frequency to a frequency lying within channel 3 or channel 4, as before mentioned. The transconductance of the tubes will be of the order of $\frac{1}{200}$. The positive fixed bias derived from the B+ supply which is applied to the control-grid electrodes 5 and 55 of the pentodes 1 and 30 may be of the order of +10 volts, and the cathode-load resistor of the network 65, may have a large value of about 1500 ohms.

In actual practice, the system of the present invention does not always operate quite in the manner above described. Particularly at certain frequencies or ranges of frequencies, the interelectrode capacitance between the screen-grid electrode 57 and the anode or plate 51 of the pentode 30, shown dotted at C, provides a secondary path for the passage of a component of the incoming radio-frequency signal R. F. into the output conductor 36, parallelling the path through the tube 30 between its cathode 53 and plate 51. This secondary path may be traced in the grounded-grid pentode 30 from, for example, the terminal 13 through the inductive reactor 77, the network 65, the coupling condenser 67 and the interelectrode capacitance C to the output conductor 36. The interelectrode capacitance C, moreover, may introduce a small ninety-degree phase-shift leading component into the signal passed from the input to the output 39. This would destroy complete cancellation of all components of the original radio-frequency signal in the output circuit 39. This effect, however, may be compensated for, in accordance with the present invention, by providing the before-mentioned inductance 77 with sufficient reactive value to produce a small component of lag corresponding substantially to −90 degrees phase shift, thus to neutralize the +90 degree phase lead introduced by the interelectrode capacitance C. The reactor 77 thus, in effect, acts as a time-delay device to compensate for the passage of any component of the radio-frequency signal R. F. through the interelectrode capacitance C into the output 39, thus to maintain substantially complete elimination of all components of the incoming signal R. F. in the output circuit 39 at all times.

While the circuit of Fig. 1 has been found to work extremely well in practice, there are cases where it is necessary to obtain somewhat better noise factor than can be obtained with the aid of pentodes. It is preferable in some instances, for example, to utilize triodes which have a much better noise factor. In Fig. 2, a modification is illustrated adapted for use with triodes, the same numerals as utilized in Fig. 1 being applied to similar elements in Fig. 2. The mixer tube 1 is shown provided with a cathode 3, control-grid electrode 5 and anode or plate 11. The incoming signal is applied through the coupling condenser 19 to the control-grid electrode 5. The oscillations to be mixed with the incoming signal are shown fed from the terminals 27, 29 to the cathode 3, the cathode load 2 of which is shunted by a cathode by-pass condenser 37 to the ground terminal 31. The output conductor 38 from the plate 11 is connected to a control-grid electrode 4 of a further electron tube 6, disposed in the single-ended output circuit 39 of the mixer 1. The cancellation or balancing tube 30 is provided with a cathode 53, grounded at 47, a control-grid electrode 55 which is connected through the coupling condenser 65 to the input terminal 13, and a plate 51 which connects by conductor 36 to the cathode 8 of the further tube 6 in the output circuit 39 of the mixer 1. Grid resistors 62 and 64 are provided between the control-grid electrodes 55 and 5 of the respective tubes 30 and 1 to the ground terminal 47.

Since the control-grid electrode 4 and the cathode 8 of the electron tube 6 are oppositely phased electrodes, it will be evident that when the components of the incoming radio-frequency signal R. F., which are passed through the tubes 1 and 30 and are respectively fed along conductors 38 and 36, are of equal amplitude, the tube 6 will not conduct. Any such components are therefore eliminated from the output circuit. For proper operation, it is again necessary that the transconductance of the triodes 1 and 30 be substantially the same. It is also preferable that the load resistor 10, connected from the control-grid electrode 4 of the electron tube 6 to the ground terminal 12 and across which the voltage from the output conductor 38 and the mixer tube 1 is developed, should have a resistance value corresponding substantially to the reciprocal of the transconductance of the triodes 1 and 3. The electron tube 6 is shown, for purposes of illustration, as of the pentode variety, the screen-grid electrode 14 of which is provided with positive voltage from the terminal therebelow labelled +, and is decoupled to ground through a condenser 16. The suppressor electrode 18 is shown grounded at 20. The plate or anode 22 is shown connected to the output tuned circuit 41, before discussed in connection with Fig. 1.

A further advantage in some instances for the circuit of Fig. 2 is that the impedance through the input of the system may now be stepped up since the grounded-cathode triode input is a high-impedance input. The same type of static balancing may also be achieved through the anode and bias voltage circuits as discussed in connection with Fig. 1, it being understood that, for purposes of simplicity, these details have been omitted from Fig. 2. Similarly a phase-shifting reactance 77 may also be employed.

Further modifications will occur to those skilled in the art and all such are considered to fall within the spirit and scope of the invention as defined in the appended claims.

What is claimed is:

1. A balanced mixer circuit for converting an alternating-current signal lying within a band of frequencies into an intermediate-frequency signal having, in combination, a electron-tube mixer stage provided with single-ended input and output circuits, means for applying an alternating-current signal lying within the said band to the input circuit, means for applying oscillations to the mixer stage of frequency differing from the frequency of the alternating-current signal by a predetermined intermediate frequency, thereby producing in the output circuit the predetermined intermediate frequency and an undesired component of the alternating-current signal, a further electron-tube stage having initially substantially the same transconductance as the mixer stage, means for connecting the further electron-tube stage between the single-ended input and output circuits of the mixer stage, means for causing the transconductance of the stages substantially to track during variation in the operating voltages thereof, thereby statically to balance the stages, and means for operating the further electron-tube stage to produce therefrom in the mixer stage single-ended output circuit a further component of the alternating-current signal having substantially the same amplitude as and opposite phase to the said undesired component of the alternating-current signal, thereby dynamically to balance out the said undesired component.

2. A balanced mixer circuit for converting an alternating-current signal lying within a band of frequencies into an intermediate-frequency signal having, in combination, a electron-tube mixer stage provided with single-ended input and output circuits, means for applying an alternating-current signal lying within the said band to the input circuit, means for applying oscillations to the mixer stage of frequency differing from the frequency of the alternating-current signal by a predetermined intermediate frequency, thereby producing in the output circuit the predetermined intermediate frequency and an undesired component of the alternating-current signal, a further electron-tube stage having initially substantially the same transconductance as the mixer stage, means for connecting the further electron-tube stage between the single-ended input and output circuits of the mixer stage, means for causing the transconductance of the stages substantially to track during variation in the operating voltages thereof, thereby statically to balance the stages, means for operating the further electron-tube stage to produce therefrom in the mixer-stage single-ended output circuit a further component of the alternating-current signal having substantially the same amplitude as and opposite phase to the said undesired component of the alternating-current signal, thereby dynamically to balance out the said undesired component, and a tuned circuit connected to the mixer-stage single-ended output circuit adjusted to respond to a frequency in the neighborhood of the said intermediate frequency.

3. A balanced mixer circuit for converting an alternating-current signal lying within a band of frequencies into an intermediate-frequency signal, having, in combination, an electron-tube mixer stage provided with single-ended input and output circuits, means for applying an alternating-current signal lying within the said band to the input circuit, means for applying oscillations to the mixer stage of frequency differing from the frequency of the alternating-current signal by a predetermined intermediate frequency, thereby producing in the outut circuit the predetermined intermediate frequency and an undesired component of the alternating-current signal, a further electron-tube stage having initially substantially the same transconductance as the mixer stage, means for connecting the further electron-tube stage between the single-ended input and output circuits of the mixer stage, means for causing the transconductance of the stages substantially to track during variation in the operating voltages thereof, thereby statically to balance the stages, means for operating the further electron-tube stage to produce therefrom in the mixer-stage single-ended output circuit a further component of the alternating-current signal having substantially the same amplitude as and opposite phase to the said undesired component of the alternating-current signal, thereby dynamically to balance out the said undesired component, and a multiply tuned circuit connected to the mixer-stage single-ended output circuit adjusted to resonate at a plurality of frequencies near the said intermediate frequency.

4. A balanced mixer circuit for converting an alternating-current signal lying within a band of frequencies into an intermediate-frequency signal having, in combination, an electron-tube mixer stage provided with single-ended input and output circuits, means for applying an alternating-current signal lying within the said band to the input circuit, means for applying oscillations to the mixer stage of frequency differing from the frequency of the alternating-current signal by a predetermined intermediate frequency, thereby producing in the output circuit the predetermined intermediate frequency and an undesired component of the alternating-current signal, a further electron-tube stage having initially substantially the same transconductance as the mixer stage, means for connecting the further electron-tube stage between the single-ended input and output circuits of the mixer stage, means for causing the transconductance of the stages substantially to track during variation in the operating voltages thereof, thereby statically to balance the stages, means for operating the further electron-tube stage to produce therefrom in the mixer-stage single-ended output circuit a further component of the alternating-current signal having subtsantially the same amplitude as and opposite phase to the said undesired component of the alternating-current signal, thereby dynamically to balance out the said undesired component, the operating means including sufficient reactance disposed in the said connecting means for introducing a sufficient time delay substantially to compensate for phase shifts introduced into the said further component by interelectrode capacitance in the further electron-tube stage.

5. A balanced mixer circuit for converting an alternating-current signal lying within a band of frequencies into an intermediate-frequency signal having, in combination, an electron-tube mixer stage provided with single-ended input and output circuits, means for applying an alternating-current signal lying within the said band to the input circuit, means for applying oscillations to the mixer stage of frequency differing from the frequency of the alternating-current signal by a predetermined intermediate frequency, thereby producing in the output circuit the predetermined intermediate frequency and an undesired component of the alternating-current signal, a further electron-tube stage having initially substantially the same transconductance as the mixer stage, means for connecting the further electron-tube stage between the single-ended input and output circuits of the mixer stage, means for causing the transconductance of the stages substantially to track during variation in the operating voltages thereof, thereby statically to balance the stages, means for operating the further electron-tube stage to produce therefrom in the mixer-stage single-ended output circuit a further component of the alternating-current signal having substantially the same amplitude as and opposite phase to the said undesired component of the alternating-current signal, thereby dynamically to balance out the said undesired component, the operating means including inductance disposed in the said connecting means of sufficient value to introduce a substantially ninety-degree lag substantially to compensate for a substantially ninety-degree lead introduced into the said further component by interelectrode capacitance in the further electron-tube stage.

6. A balanced mixer circuit for converting a radio-frequency signal lying within a band of frequencies into an intermediate-frequency signal having, in combination, an electron-tube mixer stage provided with single-ended input and output circuits, means for applying a radio-frequency signal lying within the said band to the input circuit, means for applying oscillations to the mixer stage of frequency differing from the frequency of the radio-frequency signal by a predetermined intermediate frequency, thereby producing in the output circuit the predetermined intermediate frequency and an undesired component of the radio-frequency signal, a further electron-tube stage having initially substantially the same transconductance as the mixer stage, means for connecting the further electron-tube stage between the single-ended input and output circuits of the mixer stage, means for causing the transconductance of the stages substantially to track during variation in the operating voltages thereof, thereby statically to balance the stages, and means for operaing the further electron-tube stage to produce therefrom in the mixer-stage single-ended output circuit a further component of the radio-frequency signal having substantially the same amplitude as and opposite phase to the said undesired component of the radio-frequency signal, thereby dynamically to balance out the said undesired component.

7. A balanced mixer circuit for converting a radio-frequency signal lying within a band of frequencies into an intermediate-frequency signal having, in combination, an electron-tube mixer stage provided with single-ended input and output circuits, means for applying a radio-frequency signal lying within the said band to the input circuit, means for applying oscillations to the mixer stage of frequency differing from the frequency of the radio-frequency signal by a predetermined intermediate frequency, thereby producing in the output circuit the predetermined intermediate frequency and an undesired component of the radio-frequency signal, a further electron-tube stage having initially substantially the same transconductance as the mixer stage, means for connecting the further electron-tube stage between the single-ended input and output circuits of the mixer stage, means for causing the transconductance of the stages substantially to track during variation in the operating voltages thereof, thereby statically to balance the stages, means for operating the further electron-tube stage to produce therefrom in the mixer-stage single-ended output circuit a further component of the radio-frequency signal having substantially the same amplitude as and opposite phase to the said undesired component of the radio-frequency signal, thereby dynamically to balance out the said undesired component, and a tuned circuit connected to the mixer-stage single-ended output circuit adjusted to respond to a frequency in the neighborhood of the said intermediate frequency.

8. A balanced mixer circuit for converting a radio-frequency signal lying within a band of frequencies into an intermediate-frequency signal having, in combination, an electron-tube mixer stage provided with single-ended input and output circuits, means for applying a radio-frequency signal lying within the said band to the input circuit, means for applying oscillations to the mixer stage of frequency differing from the frequency of the radio-frequency signal by a predetermined intermediate frequency, thereby producing in the output circuit the predetermined intermediate frequency and an undesired component of the radio-frequency signal, a further electron-tube stage having initially substantially the same transconductance as the mixer stage, means for connecting the further electron-tube stage between the single-ended input and output circuits of the mixer stage, means for causing the transconductance of the stages substantially to track during variation in the operating voltages thereof, thereby statically to balance the stages, means for operating the further electron-tube stage to produce therefrom in the mixer-stage single-ended output circuit a further component of the radio-frequency signal having substantially the same amplitude as and opposite phase to the said undesired component of the radio-frequency signal, thereby dynamically to balance out the said undesired component, the operating means including sufficient reactance disposed in the said connecting means for introducing a sufficient time delay substantially to compensate for phase shifts introduced into the said further component by interelectrode capacitance in the further electron-tube stage.

9. A balanced mixer circuit for converting a radio-frequency signal lying within a band of radio frequencies into an intermediate-frequency signal having, in combination, an electron-tube mixer stage provided with single-ended input and output circuits and voltage-supply circuits for providing plate voltage and a component of the plate voltage for a positive bias voltage for the stage, means for applying a radio-frequency signal lying within the said band to the input circuit, means for applying oscillations to the mixer stage of frequency differing from the frequency of the radio-frequency signal by a predetermined intermediate frequency, thereby producing in the output circuit the predetermined intermediate frequency and an undesired component of the radio-frequency signal, a further electron-tube stage provided with voltage-supply circuits for providing plate voltage and a component of the plate voltage for a positive bias voltage for the further electron-tube stage and having initially substantially the same transconductance as the mixer stage, means for connecting the further electron-tube stage between the single-ended input and output circuits of the mixer stage, means for connecting together the plate and positive bias voltage-supply circuits of the mixer and further electron-tube stages to cause the transconductance of the stages substantially to track during variation in the supply voltages, thereby statically to balance the stages, and means for operating the further electron-tube stage to produce therefrom in the mixer-stage single-ended output circuit a further component of the radio-frequency signal of substantially the same amplitude as and opposite phase to the said undesired component of the radio-frequency signal, thereby dynamically to balance out the said undesired component.

10. A balanced mixer circuit for converting a radio-frequency signal lying within a band of radio frequencies into an intermediate-frequency signal having, in combination, an electron-tube mixer stage provided with single-ended input and output circuits and voltage-supply circuits for providing plate voltage and a component of the plate voltage for a positive bias voltage for the stage, means for applying a radio-frequency signal lying within the said band to the input circuit, means for applying oscillations to the mixer stage of frequency differing from the frequency of the radio-frequency signal by a predetermined intermediate frequency, thereby producing in the output circuit the predetermined intermediate frequency and an undesired component of the radio-frequency signal, a further electron-tube stage provided with voltage-supply circuits for providing plate voltage and a component of the plate voltage for a positive bias voltage for the further electron-tube stage and having initially substantially the same transconductance as the mixer stage, means for connecting the further electron-tube stage between the single-ended input and output circuits of the mixer stage, means for connecting together the plate and positive bias voltage-supply circuits of the mixer and further electron-tube stages to cause the transconductance of the stages substantially to track during variation in the supply voltages, thereby statically to balance the stages, means for operating the further electron-tube stage to produce therefrom in the mixer-stage single-ended output circuit a further component of the radio-frequency signal of substantially the same amplitude as and opposite phase to the said undesired component of the radio-frequency signal, thereby dynamically to balance out the said undesired component, and a tuned circuit connected to the mixer-stage single-ended output circuit adjusted to respond to a frequency in the neighborhood of the said intermediate frequency.

11. A balanced mixer circuit for converting a radio-frequency signal lying within a band of radio frequencies into an intermediate-frequency signal having, in combination, an electron-tube mixer stage provided with single-ended input and output circuits and voltage-supply circuits for providing plate voltage and a component of the plate voltage for a positive bias voltage for the stage, means for applying a radio-frequency signal lying within the said band to the input circuit, means for applying oscillations to the mixer stage of frequency differing from the frequency of the radio-frequency signal by a predetermined intermediate frequency, thereby producing in the output circuit the predetermined intermediate frequency and an undesired component of the radio-frequency signal, a further electron-tube stage provided with voltage-supply circuits for providing plate voltage and a component of the plate voltage for a positive bias voltage for the further electron-tube stage and having initially substantially the same transconductance as the mixer stage, means for connecting the further electron-tube stage between the single-ended input and output circuits of the mixer stage, means for connecting together the plate and positive bias voltage-supply circuits of the mixer and further electron-tube stages to cause the transconductance of the stages substantially to track during variation in the supply voltages, thereby statically to balance the stages, means for operating the further electron-tube stage to produce therefrom in the mixer-stage single-ended output circuit a further component of the radio-frequency signal of substantially the same amplitude as and opposite phase to the said undesired component of the radio-frequency signal, thereby dynamically to balance out the said undesired component, the operating means including sufficient reactance disposed in the said connecting means for introducing a sufficient time delay substantially to compensate for phase shifts introduced into the said further component by interelectrode capacitance in the further electron-tube stage.

12. A balanced mixer circuit for converting a radio-frequency signal lying within a band of radio frequencies into an intermediate-frequency signal having, in combination, an electron-tube mixer stage provided with single-ended input and output circuits and voltage-supply circuits for providing plate voltage and a component of the plate voltage for a positive bias voltage for the stage, means for applying a radio-frequency signal lying within the said band to the input circuit, means for applying oscillations to the mixer stage of frequency differing from the frequency of the radio-frequency signal by a predetermined intermediate frequency, thereby producing in the output circuit the predetermined intermediate frequency and an undesired component of the radio-frequency signal, a further electron-tube stage provided with voltage-supply circuits for providing plate voltage and a component of the plate voltage for a positive bias voltage for the further electron-tube stage and having initially substantially the same transconductance as the mixer stage, means for connecting the further electron-tube stage between the single-ended input and output circuits of the mixer stage, means for connecting together the plate and positive bias voltage-supply circuits of the mixer and further electron-tube stages to cause the transconductance of the stages substantially to track during variation in the supply voltages, thereby statically to balance the stages, means for operating the further electron-tube stage to produce therefrom in the mixer-stage single-ended output circuit a further component of the radio-frequency signal of substantially the same amplitude as and opposite phase to the said undesired component of the radio-frequency signal, thereby dynamically to balance out the said undesired component, the operating means including inductance disposed in the said connecting means of sufficient value to introduce a substantially ninety-degree lag substantially to compensate for a substantially ninety-degree lead introduced into the said further component by interelectrode capacitance in the further electron-tube stage.

13. A balanced mixer circuit for converting a radio-frequency signal lying within a band of radio frequencies into an intermediate-frequency signal having, in combination, a multi-electrode electron-tube mixer stage provided with an anode, a cathode and a further electrode, a single-ended input circuit for applying a radio-frequency signal lying within the said band between the further electrode and the cathode, a single-ended output circuit connected to the anode, means for applying oscillations to the input circuit of frequency differing from the frequency of the radio-frequency signal by a predetermined intermediate frequency, thereby producing in the output circuit the predetermined intermediate frequency and an undesired component of the radio-frequency signal, a further multi-electrode electron-tube stage provided with an anode, a cathode and a further electrode and having substantially the same transconductance as the mixer stage, means for connecting the cathode and anode of the further electron-tube stage to the single-ended input and output circuits, respectively, of the mixer stage, means for connecting the further electrode of the further electron-tube stage to the single-ended input circuit, and means for operating the further electron-tube stage to produce therefrom in the mixer-stage single-ended output circuit, a further component of the radio-frequency signal having substantially the same amplitude as and opposite phase to the said undesired component of the radio-frequency signal, thereby dynamically to balance out the said undesired component.

14. A balanced mixer circuit for converting a radio-frequency signal lying within a band of radio frequencies into an intermediate-frequency signal having, in combination, a multi-electrode electron-tube mixer stage provided with an anode, a cathode and a further electrode, a single-ended input circuit for applying a radio-frequency signal lying within the said band between the further electrode and the cathode, a single-ended output circuit connected to the anode, means for applying oscillations to the input circuit of frequency differing from the frequency of the radio-frequency signal by a predetermined intermediate frequency, thereby producing in the output circuit the predetermined intermediate frequency and an undesired component of the radio-frequency signal, a further multi-electrode electron-tube stage provided with an anode, a cathode and a further electrode and having substantially the same transconductance as the mixer stage, means for connecting the cathode and anode of the further electron-tube stage to the single-ended input and output circuits, respectively, of the mixer stage, means for connecting the further electrode of the further electron-tube stage to the single-ended input circuit, means for operating the further electron-tube stage to produce therefrom in the mixer-stage single-ended output circuit a further component of the radio-frequency signal having substantially the same amplitude as and opposite phase to the said undesired component of the radio-frequency signal, thereby dynamically to balance out the said undesired component, the operating means including sufficient reactance disposed in the said connecting means for introducing a sufficient time delay substantially to compensate for phase shifts introduced into the said further component by interelectrode capacitance in the further electron-tube stage.

15. A balanced mixer circuit for converting a radio-frequency signal lying within a band of radio frequencies into an intermediate-frequency signal having, in combination, a multi-electrode electron-tube mixer stage provided with an anode, a cathode and a further electrode, a single-ended input circuit for applying a radio-frequency signal lying within the said band between the further electrode and the cathode, a single-ended output circuit connected to the anode, means for applying oscillations to the input circuit of frequency differing from the frequency of the radio-frequency signal by a predetermined intermediate frequency, thereby producing in the output circuit the predetermined intermediate frequency and an undesired component of the radio-frequency signal, a further multi-electrode electron-tube stage provided with an anode, a cathode and a further electrode and having substantially the same transconductance as the mixer stage, means for connecting the cathode and anode of the further electron-tube stage to the single-ended input and output circuits, respectively, of the mixer stage, means for connecting the further electrode of the further electron-tube stage to the single-ended input circuit, means for operating the further electron-tube stage to produce therefrom in the mixer-stage single-ended output circuit a further component of the radio-frequency signal having substantially the same amplitude as and opposite phase to the said undesired component of the radio-frequency signal, thereby dynamically to balance out the said undesired component, the operating means including inductance disposed in the said connecting means of sufficient value to introduce a substantially ninety-degree lag substantially to compensate for a substantially ninety-degree lead introduced into the said further component by interelectrode capacitance in the further electron-tube stage.

16. A balanced mixer circuit for converting a radio-frequency signal lying within a band of radio frequencies into an intermediate-frequency signal having, in combination, a grounded-cathode pentode mixer stage provided with single-ended input and output circuits, means for applying to the input circuit a radio-frequency signal lying within the said band, means for applying to the input circuit oscillations of frequency differing from the frequency of the radio-frequency signal by a predetermined intermediate frequency, thereby producing in the output circuit the predetermined intermediate frequency and an undesired component of the radio-frequency signal, a further pentode stage provided with a grounded grid and having substantially the same transconductance as the mixer stage, an electrical connection for connecting the further pentode stage between the single-ended input and output circuits of the mixer stage, and means for adjusting the currents through the stages so that the amplitude of the further component of the radio-frequency signal fed from the further pentode stage to the mixer-stage single-ended output circuit will be substantially equal, though of opposite phase, to the said undesired component of the radio-frequency signal, thereby dynamically to balance out the said undesired component.

17. A balanced mixer circuit for converting a radio-frequency signal lying within a band of radio frequencies into an intermediate-frequency signal having, in combination, a grounded-cathode pentode mixer stage provided with single-ended input and output circuits, means for applying to the input circuit a radio-frequency signal lying within the said band, means for applying to the input circuit oscillations of frequency differing from the frequency of the radio-frequency signal by a predetermined intermediate frequency, thereby producing in the output circuit the predetermined intermediate frequency and an undesired component of the radio-frequency signal, a further pentode stage provided with a grounded control-grid electrode and having substantially the same transconductance as the mixer stage, an electrical connection for connecting the further pentode stage between the single-ended input and output circuits of the mixer stage, means for supplying anode and screen-grid voltages to the pentode stages and positive components of the anode voltage to the control-grid electrodes of both stages whereby variations in the anode voltage may produce directly proportional changes in the current flowing in the stages causing the transconductance of the stages substantially to track during such variation, thereby statically to balance the stages, and means for adjusting the currents through the stages so that the amplitude of the further component of the radio-frequency signal fed from the further pentode stage to the mixer-stage single-ended output circuit will be substantially equal, though of opposite phase, to the said undesired component of the radio-frequency signal, thereby dynamically to balance out the said undesired component.

18. A balanced mixer circuit for converting a radio-frequency signal lying within a band of radio frequencies into an intermediate-frequency signal having, a combination, a grounded-cathode pentode mixer stage provided with single-ended input and output circuits, means for applying to the input circuit a radio-frequency signal lying within the said band, means for applying to the input circuit oscillations of frequency differing from the frequency of the radio-frequency signal by a predetermined intermediate frequency, thereby producing in the output circuit the predetermined intermediate frequency and an undesired component of the radio-frequency signal, a further pentode stage provided with a grounded control-grid electrode and having substantially the same transconductance as the mixer stage, an electrical connection for connecting the further pentode stage between the single-ended input and output circuits of the mixer stage, means for supplying anode and screen-grid voltages to the pentode stages and positive components of the anode voltage to the control-grid electrodes of both stages whereby variations in the anode voltage may produce directly proportional changes in the current flowing in the stages causing the transconductance of the stages substantially to track during such variation, thereby statically to balance the stages, means for adjusting the currents through the stages so that the amplitude of the further component of the radio-frequency signal fed from the further pentode stage to the mixer-stage single-ended output circuit will be substantially equal, though of opposite phase, to the said undesired component of the radio-frequency signal, thereby dynamically to balance out the said undesired component, and means for maintaining the said dynamic balance comprising reactance disposed in the said electrical connection for introducing a sufficient time delay substantially to compensate for phase shifts introduced into the said further component of the radio-frequency signal by interelectrode capacitance in the further pentode stage.

19. A balanced mixer circuit for converting a radio-frequency signal lying within a band of radio frequencies into an intermediate-frequency signal having, in combination, a pentode mixer stage provided with an anode, a cathode, a control-grid electrode, a screen-grid electrode and a suppressor-grid electrode; an electrical connection for grounding the cathode, an electrical connection for grounding the suppressor-grid electrode, a single-ended input circuit connected to the control-grid electrode for applying thereto a radio-frequency signal lying within the said band, a single-ended output circuit connected to the anode, and means for applying to a point of the cathode-grounding electrical connection that is above ground potential oscillations of frequency differing from the frequency of the radio-frequency signal by a predetermined intermediate frequency, thereby producing in the output circuit the predetermined intermediate frequency and an undesired component of the radio-frequency signal; a further pentode stage provided with an anode, a cathode, a control-grid electrode, a screen-grid electrode and a suppressor-grid electrode and having substantially the same transconductance as the mixer stage; an electrical connection for grounding the further pentode stage control-grid electrode, an electrical connection for grounding the further pentode stage suppressor-grid electrode, electrical connections for connecting the cathode and the anode of the further pentode stage to the single-ended input and output circuits, respectively, of the mixer stage, and an electrical connection for connecting the further pentode stage screen-grid electrode to the single-ended input circuit; means for supplying anode and screen-grid voltages to the pentode stages and positive components of the anode voltage to the control-grid electrodes of both stages whereby variations in the anode voltage may produce directly proportional changes in the current flowing between the anodes and cathodes of the stages causing the transconductance of the stages substantially to track during such variation, thereby statically to balance the stages; and means for adjusting the currents through the stages in order that the amplitude of the further component of the radio-frequency signal appearing at the anode of the further pentode stage and fed therefrom to the mixer-stage single-ended output circuit will be substantially equal, though of opposite phase, to the said undesired component of the radio-frequency signal, thereby dynamically to balance out the said undesired component.

20. A balanced mixer circuit for converting a radio-frequency signal lying within a band of radio frequencies into an intermediate-frequency signal having, in combination, a pentode mixer stage provided with an anode, a cathode, a control-grid electrode, a screen-grid electrode and a suppressor-grid electrode; an electrical connection for grounding the cathode, an electrical connection for grounding the suppressor-grid electrode, a single-ended input circuit connected to the control-grid electrode for applying thereto a radio-frequency signal lying within the said band, a single-ended output circuit connected to the anode, and means for applying to a point of the cathode-grounding electrical connection that is above ground potential oscillations of frequency differing from the frequency of the radio-frequency signal by a predetermined intermediate frequency, thereby producing in the output circuit the predetermined intermediate frequency and an undesired component of the radio-frequency signal; a further pentode stage provided with an anode, a cathode, a control-grid electrode, a screen-grid electrode and a suppressor-grid electrode and having substantially the same transconductance as the mixer stage; an electrical connection for grounding the further pentode stage control-grid electrode, an electrical connection for grounding the further pentode stage suppressor-grid electrode, electrical connections for connecting the cathode and the anode of the further pentode stage to the single-ended input and output circuits, respectively, of the mixer stage, and an electrical connection for connecting the further pentode stage screen-grid electrode to the single-ended input circuit; means for supplying anode and screen-grid voltages to the pentode stages and positive components of the anode voltage to the control-grid electrodes of both stages whereby variations in the anode voltage may produce directly proportional changes in the current flowing between the anodes and cathodes of the stages causing the transconductance of the stages substantially to track during such variation, thereby statically to balance the stages; means for adjusting the currents through the stages in order that the amplitude of the further component of the radio-frequency signal appearing at the anode of the further pentode stage and fed therefrom to the mixer-stage single-ended output circuit will be substantially equal, though of opposite phase, to the said undesired component of the radio-frequency signal, thereby dynamically to balance out the said undesired component; and means for maintaining the said dynamic balance comprising reactance disposed in the said electrical connections from the cathode and anode of the further pentode stages to the single-ended input and output circuits, respectively, for introducing a sufficient time delay substantially to compensate for phase shifts introduced into the said further component of the radio-frequency signal by screen-grid-to-anode capacitance in the further pentode stage.

21. A balanced mixer circuit for converting a radio-frequency signal lying within a band of radio frequencies into an intermediate-frequency signal having, in combination, a triode mixer stage provided with single-ended input and output circuits, the output circuit including an electron tube having a pair of oppositely-phased electrodes to one of which the output of the mixer stage is applied, means for applying a radio-frequency signal lying within the said band to the input circuit, means for applying oscillations to the mixer stage of frequency differing from the frequency of the radio-frequency signal by a predetermined intermediate frequency, thereby producing in the output circuit the predetermined intermediate frequency and an undesired component of the radio-frequency signal, a further triode stage having substantially the same transconductance as the mixer stage, means for connecting the further triode stage between the single-ended input circuit and the other of the said pair of electrodes, and means for operating the further triode stage to produce therefrom at the said other of the pair of electrodes a further component of the radio-frequency signal having substantially the same amplitude as the said undesired component of the radio-frequency signal, thereby dynamically to balance the said undesired component out of the output circuit.

22. A balanced mixer circuit as claimed in claim 21 and in which the further electron tube is provided with at least an anode, a cathode and a control electrode, the electrodes of the said pair of electrodes are the control electrode and the cathode, and the control electrode is provided with a load of impedance substantially equal to the reciprocal of the said transconductance.

23. A balanced mixer circuit as claimed in claim 22 and in which the said anode is connected to a tuned circuit adjusted to respond to a frequency in the neighborhood of the said intermediate frequency.

References Cited in the file of this patent

UNITED STATES PATENTS

| | | |
|---|---|---|
| 1,258,548 | Englund | Mar. 5, 1918 |
| 2,122,283 | Harris | June 28, 1938 |
| 2,171,151 | Urtel | Aug. 29, 1939 |
| 2,443,754 | Vale | June 22, 1948 |
| 2,499,568 | Bucher | Mar. 7, 1950 |
| 2,521,116 | Doba | Sept. 5, 1950 |
| 2,565,409 | Thompson | Aug. 21, 1951 |
| 2,606,284 | Van Weel | Aug. 5, 1952 |